United States Patent
Iizumi et al.

(10) Patent No.: US 8,334,527 B2
(45) Date of Patent: Dec. 18, 2012

(54) ELECTROLUMINESCENT DEVICE

(75) Inventors: Yasuhiro Iizumi, Setagaya-ku (JP); Masaya Shimogawara, Tsukuba (JP)

(73) Assignee: Dai Nippon Printing Co., Ltd., Tokyo-To (JP)

( * ) Notice: Subject to any disclaimer, the term of this patent is extended or adjusted under 35 U.S.C. 154(b) by 219 days.

(21) Appl. No.: 12/680,439

(22) PCT Filed: Sep. 26, 2008

(86) PCT No.: PCT/JP2008/067458
§ 371 (c)(1),
(2), (4) Date: Mar. 26, 2010

(87) PCT Pub. No.: WO2009/041596
PCT Pub. Date: Apr. 2, 2009

(65) Prior Publication Data
US 2010/0224856 A1    Sep. 9, 2010

(30) Foreign Application Priority Data
Sep. 28, 2007  (JP) ................................. 2007-256871

(51) Int. Cl.
*H01L 29/12* (2006.01)
(52) U.S. Cl. .............. 257/40; 257/13; 257/E39.007; 257/E51.01; 257/E51.012; 257/E51.024; 257/E51.046; 257/E27.117
(58) Field of Classification Search .................. None
See application file for complete search history.

(56) References Cited

U.S. PATENT DOCUMENTS

| | | | | |
|---|---|---|---|---|
| 2001/0038961 A1* | 11/2001 | Sugai et al. | ................. | 430/58.25 |
| 2003/0042850 A1* | 3/2003 | Bertram et al. | ............... | 313/504 |
| 2007/0195431 A1* | 8/2007 | Asakura et al. | ............... | 359/707 |
| 2009/0085473 A1 | 4/2009 | Ilzumi et al. | | |
| 2009/0087546 A1 | 4/2009 | Ilzumi et al. | | |
| 2009/0087792 A1 | 4/2009 | Ilzumi et al. | | |

FOREIGN PATENT DOCUMENTS

| | | |
|---|---|---|
| JP | 2000-249821 | 9/2000 |
| JP | 2004-303592 | 10/2004 |
| JP | 2005-502176 | 1/2005 |
| JP | 2005-53105 | 3/2005 |
| JP | 2005-522005 | 7/2005 |
| JP | 2005-533892 | 11/2005 |
| JP | 2006-520077 | 8/2006 |
| JP | 2007-21670 | 2/2007 |
| JP | 2008-522005 | 6/2008 |
| WO | WO 2006/062656 A2 | 6/2006 |
| WO | WO 2006/062656 A3 | 6/2006 |

OTHER PUBLICATIONS

U.S. Appl. No. 12/680,418, filed Mar. 26, 2010, Akai, et al.
U.S. Appl. No. 12/680,638, filed Mar. 29, 2010, Akai, et al.
Office Action issued Mar. 25, 2011, in Chinese Patent Application No. 200880109667.8 with English translation.

* cited by examiner

*Primary Examiner* — Fei Fei Yeung Lopez
(74) *Attorney, Agent, or Firm* — Oblon, Spivak, McClelland, Maier & Neustadt, L.L.P.

(57) ABSTRACT

Provided is an electroluminescent device which has a luminescent layer including quantum dots and which are excellent in life characteristics. An electroluminescent device (1) comprises a first electrode layer (3), a luminescent layer (4) formed on the first electrode layer, and a second electrode layer (5) formed on the luminescent layer. The luminescent layer uses quantum dots (12), each quantum dot being surrounded by silane coupling agent (11).

2 Claims, 1 Drawing Sheet

ELECTROLUMINESCENT DEVICE

TECHNICAL FIELD

The present invention relates to an electroluminescent (hereinafter sometimes abbreviated to EL) device having a luminescent layer including quantum dots.

BACKGROUND ART

An EL device is that holes and electrons, injected from two facing electrodes, combine with each other in a luminescent layer so as to generate energy by which a luminescent material in the luminescent layer is excited to emit light whose color depends on the luminescent material. EL devices are widely used for displays, lighting systems, etc. as panel light-emitting devices of self-emission type.

In recent years, light-emitting devices comprising luminescent layers containing semiconductor quantum dots have been proposed and developed. A quantum dot is a crystal composed of two or more semiconductor atoms, having a size in the order of several nanometers to several tens nanometers. In such a nanometer-sized small crystal, electrons do not form a continuous band structure but exist in discrete energy levels. That is to say, since such small crystals remarkably show the quantum size effect, their electron confinement effect is greater than that of bulk crystals, which are larger than quantum dots in size. Thus, nanometer-sized crystals can increase the probability of recombination of excitons.

Further, in light-emitting devices using quantum dots, it is possible to regulate emission frequency without changing their constitution. Because of its quantum confinement effect, a quantum dot has optical properties that are dependent on its size. For example, it is possible to change the luminescent color of a quantum dot consisting of CdSe from blue to red by merely changing the size of the quantum dot. Furthermore, a quantum dot has a relatively narrow spectrum half width, and the half width can be made less than 30 nm, for example. It can therefore be said that quantum dots are excellent as materials for luminescent layers.

Quantum dots are also called nanocrystals, fine particles, colloids, clusters, etc. In this Specification, those crystals, particles, and the like that have the quantum size effect are all included in quantum dots.

Known as processes for forming luminescent layers using such quantum dots include spin coating and dip coating that use a colloidal solution containing quantum dots having a ligand, such as tri-n-octylphosphine oxide (TOPO), attached to their surfaces (see JP 2005-522005T and JP 2006-520077T, for example). the ligand attaches to the surfaces of the quantum dots, and makes the dispersion stability of the quantum dots high.

In a conventional luminescent layer using quantum dots having a ligand, such as TOPO, attached to their surfaces, however, the quantum dots are not stable, which may affect the life characteristics of the luminescent layer. Especially when the quantum dots are phosphorescent, the life characteristics of the luminescent layer are apt to be affected because phosphorescent materials are longer in life than fluorescent ones.

DISCLOSURE OF INVENTION

In light of the above circumstances, the present invention was accomplished. A main object of the present invention is to provide an EL device comprising a luminescent layer including a quantum dot, excellent in life characteristics.

To fulfill the above object, the present invention provides an EL device comprising: a first electrode layer; a second electrode layer situated opposite to the first electrode layer; and a luminescent layer situated between the first electrode layer and the second electrode layer, wherein the luminescent layer has a quantum dot, and situated around the quantum dot is a silane coupling agent.

In the present invention, since a silane coupling agent is used as a ligand for the quantum dot, the luminescent layer can get hardened. In such a hardened luminescent layer, the quantum dots can exist stably, which leads to improvement in life characteristics. Furthermore, since the molecular design of silane coupling agents is relatively easy, it is easy to improve life characteristics by using silane coupling agents that have functional groups different in functionality.

In the present invention, it is preferred that the luminescent layer include a hydrolysate-condensation product of the silane coupling agent to get hardened. As described above, the quantum dots can exist stably in such a hardened luminescent layer, which leads to improvement in life characteristics. Moreover, the silane coupling agent in the luminescent layer binds to a layer lying under the luminescent layer (the first electrode layer, a hole injection and transport layer (hole injection-transport layer), etc.) so as to increase the adhesion between the luminescent layer and the layer lying under the luminescent layer, and also so as to increase the thermal stability (Tg: glass transition temperature) of the luminescent layer.

In the present invention, the hydrolysate-condensation product of the silane coupling agent may be an organopolysiloxane that is a hydrolysate- or co-hydrolysate-condensation product of one, or two or more silicon compounds having the formula $Y_n SiX_{(4-n)}$. In this formula, Y represents an alkyl group, a fluoroalkyl group, a vinyl group, an amino group, a phenyl group, or an epoxy group; X represents an alkoxyl group, an acetyl group, or a halogen; and n is an integer of 0 to 3. Since the molecular design of such organopolysiloxanes is relatively easy, it is possible to control the degree of condensation, etc. by selecting suitable groups for X and Y. By controlling the degree of condensation, etc., it is possible to obtain the desired stability of the quantum dots in the luminescent layer.

In the present invention, the hydrolysate-condensation product of the silane coupling agent may also be an organopolysiloxane that is a hydrolysate- or co-hydrolysate-condensation product of one, or two or more silicon compounds having the formula $Y_n SiX_{(4-n)}$. In the formula, Y is a functional group bound to either directly or via a vinyl or phenyl group, the functional group having at least one of the property of transporting holes and the property of transporting electrons; and X represents an alkoxyl group, an acetyl group, or a halogen. n in the formula is an integer of 0 to 3. Since the molecular design of such organopolysiloxanes is relatively easy, it is possible to produce organopolysiloxanes containing functional groups different in functionality and thus to improve life characteristics.

In the present invention, the luminescent layer may further include at least one of a hole transport material (hole-transporting material) and an electron transport material (electron-transporting material). If the luminescent layer further contains such a material, it can acquire not only the function of emitting light but also the function of transporting holes, the functions of transporting electrons or the like. This makes it possible to simplify the lamination (lamination structure) of the EL device. In an EL device simplified in lamination, the transport of charges into the luminescent layer and the transfer of the energy of excitons produced by recombination of holes and electrons to the luminescent layer can be done efficiently, and the EL device can have improved life characteristics.

In the present invention, the EL device may further comprise a layer serving as at least one of a hole injection layer (hole-injecting layer) and a hole transport layer (hole-transporting layer) between the first electrode layer and the luminescent layer. Such a layer stabilizes the injection of holes into the luminescent layer and makes the transport of holes smooth, which leads to increase in luminous efficiency. Particularly, in the case where a hole transport layer is formed between the first electrode layer and the luminescent layer, it is possible to form the hole transport layer and the luminescent layer simultaneously by using phase separation as will be described later.

In the above case, the hole-control layer and the luminescent layer may be phase separated. Such layers can further improve luminous efficiency and life characteristics.

In the present invention, it is preferred that the quantum dot have: a core part made of a semiconductor fine particle; and a shell part covering the core part, the shell part being made from a material having a greater band gap than the semiconductor fine particle. A quantum dot having such a structure can have high stability.

In the present invention, a silane coupling agent is used as a ligand for the quantum dot. The present invention can therefore provide an EL device excellent in life characteristics.

MODE FOR CARRYING OUT THE INVENTION

One embodiment of the EL device according to the present invention will be described hereinafter in detail. The EL device comprises a first electrode layer, a luminescent layer formed on the first electrode layer, and a second electrode layer formed on the luminescent layer. This EL device is characterized in that the luminescent layer includes quantum dots and each quantum dot being surrounded by a silane coupling agent.

Figure 1:
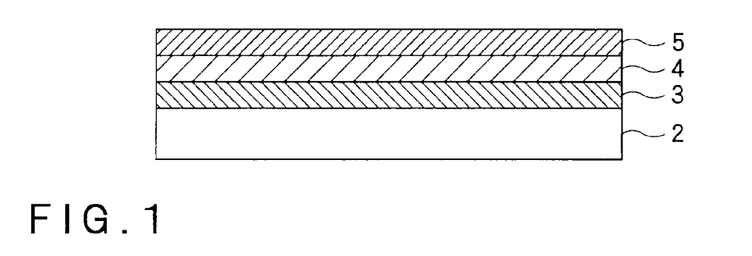
FIG. 1 is a sectional view schematically showing an embodiment of the EL device of the present invention.

The EL device of this embodiment will be described with reference to the accompanying drawings. FIG. 1 is a cross-sectional view schematically showing the EL device of this embodiment. As illustrated in FIG. 1, the EL device 1 comprises a first electrode layer 3, a luminescent layer 4, and a second electrode 5 that are successively layered on a substrate 2.

Figure 2:
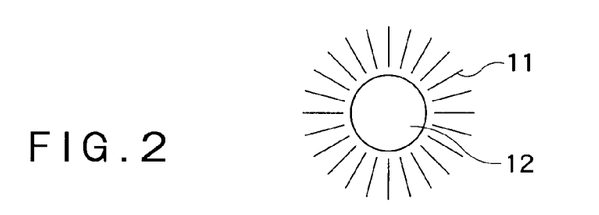
FIG. 2 is a diagrammatic view showing a quantum dot surrounded by silane coupling agent.

Further, in the luminescent layer 4 used are quantum dots 12, each quantum dot being surrounded by a silane coupling agent 11, as illustrated in FIG. 2. That is to say, the silane coupling agent 11 are attached to the surface of the quantum dot 12 as a ligand. Such quantum dots 12 having the silane coupling agent 11 attached to their surfaces are used in the luminescent layer 4. The silane coupling agent 11 and the quantum dot 12 bound to each other by coordinate bond. If the quantum dot 12 is a compound semiconductor, —OH residue of Si—OH group in a hydrolysate of the silane coupling agent can bound to the quantum dot by a coordinate bond, because the surfaces of inorganic materials are generally lyophilic.

That "the luminescent layer uses (includes) a quantum dot, and a silane coupling agent is situated around the quantum dot" includes all of the following cases: the case where the silane coupling agent situated around the quantum dot is the silane coupling agent itself; the case where the silane coupling agent situated around the quantum dot is a hydrolysate of the silane coupling agent; and the case where the silane coupling agent situated around the quantum dot is a hydrolysate-condensation product of the silane coupling agent. That is to say, in the luminescent layer, the quantum dot may be surrounded by the silane coupling agent itself, or by a hydrolysate of the silane coupling agent, or by a hydrolysate-condensation product of the silane coupling agent. Moreover, the silane coupling agent, its hydrolysate, and its hydrolysate-condensation product may co-exist around the quantum dot.

As described above, the silane coupling agent is used as a ligand for the quantum dot, so that the luminescent layer can get hardened. In the hardened luminescent layer, the quantum dots can show high stability, which leads to improvement in life characteristics. Further, since the molecular design of silane coupling agents is relatively easy, it is possible to improve life characteristics by the use of silane coupling agents having functional groups different in functionality.

When the luminescent layer is a hardened layer including a hydrolysate-condensation product of the silane coupling agent, the silane coupling agent binds to a layer lying under the luminescent layer (the first electrode layer, a hole-injection-transport layer, etc.). This increases the adhesion between the luminescent layer and the layer lying under the luminescent layer, and also the thermal stability (Tg: glass transition temperature) of the luminescent layer.

Moreover, when forming a hole control layer such as: a hole injection layer (hole-injecting layer); a hole transport layer (hole-transporting layer); and a hole injection and transport layer (hole-injection-transport layer), or an electron control layer such as: an electron injection layer (electron-injecting layer); an electron transport layer (electron-transporting layer) on the hardened luminescent layer by the use of a coating liquid, it is possible to form the layer stably without causing dissolution of the luminescent layer in a solvent in the coating liquid for forming the layer.

Constituent layers of the EL device will be described below.

1. Luminescent Layer

The luminescent layer 4 is situated between the first electrode layer 3 and the second electrode layer 5, uses (includes) the quantum dots 12, each quantum dot being surrounded by silane coupling agent (silane coupling agent molecules) 11, and has the function of providing a space where electrons and holes recombine with each other so as to emit light.

It is possible to use any luminescent layer as long as it contains quantum dots, each quantum dot being surrounded by silane coupling agent. For example, the luminescent layer may contain only the quantum dots, each quantum dot being surrounded by silane coupling agent, or the luminescent layer may contain these quantum dots and at least one of a hole transport material and an electron transport material. In the latter case, the luminescent layer can have not only the function of emitting light but also the function of transporting holes or the function of transporting electrons. This makes it possible to simplify the lamination (lamination structure) of the EL device. Moreover, the transport of charges to the luminescent layer and the transfer of the energy of excitons produced by the recombination of holes and electrons to the luminescent layer can be done efficiently, which leads to improvement in life characteristics.

Components of the luminescent layer will be described below.

(1) Quantum Dots

Any quantum dot can be used in the luminescent layer, as long as it emits fluorescent or phosphorescent light. Particularly, quantum dots containing so-called compound semiconductors are preferred. Examples of compound semiconductors include compounds of Group IV, Groups I-VII, Groups II-VI, Groups II-V, Groups III-VI, Groups III-V, Groups IV-VI, Groups I-III-VI, Groups II-IV-VI, and Groups II-IV-V. Specific examples of these compounds include ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TAs, TlSb, PbS, PbSe, PbTe, and mixtures of these compounds. Of these compound semiconductors, CdSe is preferred from the viewpoint of flexibility and optical properties.

In the present invention, the quantum dot may be composed only of a core part that is made of a semiconductor fine particle, for example. Alternatively, the quantum dot may be composed of a core part made of a semiconductor fine particle and a shell part covering the core part, made from a material having a greater band gap than the semiconductor fine particle. Particularly, it is preferred that the quantum dot be composed of the above core and shell parts. That is to say, a core-shell-type quantum dot having core/shell structure is preferred. This is because a core-shell-type quantum dot has higher stability.

A fine particle of any of the above-enumerated compound semiconductors is favorably used as the semiconductor fine particle for the core part of the quantum dot.

The above-described compound semiconductors to be used for the core part are used also for the shell part, and it is preferred that the material for the shell part have a band gap greater than a band gap of semiconductor fine particle. The compound semiconductor to be used for the shell part may be either the same as, or different from, the compound semiconductor used for the core part.

Examples of the core-shell-type quantum dot include CdSe (core part)/CdS (shell part), CdSe/ZnS, CdTe/CdS, InP/ZnS, GaP/ZnS, Si/ZnS, InN/GaN, InP/CdSSe, InP/ZnSeTe, GaInP/ZnSe, GaInP/ZnS, Si/AlP, InP/ZnSTe, GaInP/ZnSTe, and GaInP/ZnSSe. Of these quantum dots, CdSe/ZnS is preferred from the viewpoint of flexibility and optical properties.

Examples of the shape of the quantum dot include spheres, rods, and discs. The shape of the quantum dot can be confirmed by a transmission electron microscope (TEM).

It is preferred that the particle diameter of the quantum dot be less than 20 nm, more preferably from 1 to 15 nm, and particularly from 1 to 10 nm. This is because the quantum size effect may not be obtained when the quantum dot has an excessively large particle diameter. Since the quantum dot produces emission spectrum that varies depending on its particle diameter, the particle diameter of the quantum dot may be selected according to the desired color. For example, in the case of a core/shell-type quantum dot consisting of CdSe/ZnS, the emission spectrum of the quantum dot shifts to the longer wavelength side as the particle diameter of the quantum dot increases, and the quantum dot emits red spectrum when its particle diameter is 5.2 nm and blue spectrum when its particle diameter is 1.9 nm. Further, it is preferred that the particle diameter distribution of the quantum dots be relatively narrow. The particle diameter of the quantum dot can be determined using a transmission electron microscope (TEM), a powder X-ray diffraction (XRD) pattern, or UV/Vis absorption spectrum.

The luminescent layer may contain any amount of the quantum dot surrounded by molecules of a silane coupling agent, as long as the luminescent layer can emit light. The quantum dot content of the luminescent layer is suitably determined by the type of the materials to be used for the luminescent layer. For example, when the luminescent layer uses only the quantum dots, each quantum dot being surrounded by silane coupling agent molecules, the quantum dot content of the luminescent layer is preferably from 50 to 100% by weight, particularly from 60 to 100% by weight, of the luminescent layer. If the quantum dot is used in an excessively low proportion, the luminescent layer may not emit light sufficiently, and moreover, the luminescent layer may not fully harden when subjected to hardening. On the other hand, if the quantum dot is used in an excessively high proportion, it may be difficult to form the luminescent layer.

When the luminescent layer uses the quantum dots surrounded by silane coupling agent and also at least one of a hole transport material and an electron transport material, the quantum dot content of the luminescent layer is preferably from 10 to 90% by weight, particularly from 30 to 70% by weight, of the luminescent layer. When the luminescent layer has an excessively low quantum dot content, the luminescent layer may not emit light sufficiently, and moreover, the luminescent layer may not fully harden when subjected to hardening. On the other hand, when the luminescent layer has an excessively high quantum dot content, it may be difficult for the luminescent layer to show the property of transporting holes, the property of transporting electrons, or the like.

As for methods for synthesizing the quantum dots, reference can be made to JP No. 2008-522005A, JP No. 2006-520077T, JP 2007-21670A, and so forth.

Further, it is possible to replace a ligand attached to a quantum dot surface with other ligand. For example, it is possible to replace a ligand such as TOPO, attached to the surfaces of quantum dots with a silane coupling agent, by mixing the quantum dots and a large amount of the silane coupling agent. The replacement of the ligand can be conducted at around room temperature. As for methods for replacing ligands, reference can be made to JP No. 2007-21670A, and so forth.

Examples of commercially available quantum dots having a ligand, such as TOPO, attached to their surfaces include fluorescent semiconductor nanocrystals "Evidot" manufactured by evident TECHNOLOGIES, USA.

(2) Silane Coupling Agent

Silane coupling agents for use in the luminescent layer will be described below. Examples of silane coupling agents that can coordinate to the quantum dot so as to stabilize the quantum dot and that do not affect the life characteristics of the quantum dot include (a) chloro- or alkoxy-silanes, etc., and (b) reactive silicones.

Silicon compounds having by the following general formula:

$$Y_n SiX_{(4-n)}$$

are favorably used as the above compounds (a), chloro- or alkoxy-silanes, etc. In the above general formula, Y represents an alkyl group, a fluoroalkyl group, vinyl group, amino group, phenyl group, or poxy group; X represents an alkoxyl group, acetyl group, or a halogen; and n is an integer of 0 to 3. These silicon compounds can be used singly. Alternatively, two or more of the silicon compounds may be used in combination.

In the silicon compound having the above formula, X is the end part and also the coordinating part with which the silicon compound coordinates to the quantum dot. The end part is the position at which condensation reaction takes place; that is to say, the end part connects the quantum dots, each quantum dot being surrounded by the silane coupling agent, insolubilizes the luminescent layer, and contributes to improvement in the adhesion between the luminescent layer and a layer lying under the luminescent layer.

The alkoxyl group represented by X is preferably methoxy group, ethoxy group, propoxy group, or butoxy group.

In the silicon compound having the above formula, Y is a functional part. For example, when Y is an alkyl group, it serves as a spacer between the quantum dots and is a part that contributes to solubility. When Y is a fluoroalkyl group, it serves as a spacer between the quantum dots and is a part that shows liquid-repellency. When Y is vinyl group, it serves as a spacer between the quantum dots and is a part that forms a π-conjugated system. When Y is amino group, it serves as a spacer between the quantum dots and is a part that shows lyophilicity. When Y is phenyl group, it serves as a spacer between the quantum dots and is a part that shows water-repellency. When Y is epoxy group, it serves as a spacer between the quantum dots and is a part that contributes to hardening ability.

Preferably, the group represented by Y has 1 to 20 carbon atoms

Specifically, the silicon compounds described in JP No. 2000-249821A can be used herein as the silicon compounds having the above formula.

Further, other silicon compounds having the following general formula:

are also favorably used as the above compounds (a), chloro- or alkoxy-silanes, etc. In the above general formula, Y represents a functional group having the property of transporting holes, bound to the silicon atom directly or via vinyl or phenyl group; a functional group having the property of transporting electrons, bound to the silicon atom directly or via vinyl or phenyl group; or a functional group capable of showing both the property of transporting holes and the property of transporting electrons, bound to the silicon atom directly or via vinyl or phenyl group. In the above formula, X represents an alkoxyl group, acetyl group, or a halogen, and n is an integer of 0 to 3. These silicon compounds can be used singly. Alternatively, two or more of the silicon compounds may be used in combination.

In the silicon compound having the above formula, X is the end part and also the coordinating part with which the silicon compound coordinates to the quantum dot. The end part is the position at which condensation reaction takes place; that is to say, the end part connects the quantum dots, each quantum dot being surrounded by the silane coupling agent, insolubilizes the luminescent layer, and contributes to improvement in the adhesion between the luminescent layer and a layer lying under the luminescent layer.

The alkoxyl group represented by X is preferably methoxy group, ethoxy group, propoxy group, or butoxy group.

In the silicon compound having the above formula, Y is a functional part. For example, when Y is a functional group having the property of transporting holes, bound to the silicon atom directly or via vinyl or phenyl group, it serves as a spacer between the quantum dots and is a part that shows the property of transporting holes. When Y is a functional group having the property of transporting electrons, bound to the silicon atom directly or via vinyl or phenyl group, it serves as a spacer between the quantum dots and is a part that shows the property of transporting electrons. When Y is a functional group capable of showing both the property of transporting holes and the property of transporting electrons, bound to the silicon atom directly or via vinyl or phenyl group, it serves as a spacer between the quantum dots and is a part that can show both the property of transporting holes and that of transporting electrons.

When Y is a functional group having the property of transporting holes, it is preferred that Y be bound to the silicon atom via vinyl or phenyl group. This is because vinyl or phenyl group is a part that forms a π-conjugated system.

Examples of functional groups having the property of transporting holes include aromatic amine groups having one or more N atoms, and substituted or unsubstituted aryl groups having 6 to 16 carbon atoms. Aromatic amine groups having one or more N atoms are preferably aromatic tertiary amine groups having one or more N atoms. Specific examples of such functional groups include N,N'-bis(naphthalen-1-yl)-N,N'-bis(phenyl)-benzidine (α-NPD) and triphenylamines such as 4,4,4-tris(3-methylphenylphenylamino)triphenylamine (MTDATA). Examples of triphenylamines include compounds having a structure represented by the following formula.

[Chemical formula 1]

Examples of aryl groups having 6 to 16 carbon atoms include phenyl group, naphthyl group, tolyl group, xylyl group, anthryl group, phenanthryl group, biphenyl group, naphthacene group, and pentacenyl group.

When Y is a functional group having the property of transporting electrons, it is preferred that Y be bound to the silicon atom via vinyl or phenyl group. This is because vinyl or phenyl group is a part that forms a π-conjugated system. Examples of functional groups having the property of transporting electrons include phenanthrolines, triazoles, oxadiazoles, and aluminum quinolinols. Specific examples of such functional groups include Bathocuproine (BCP), Bathophenanthroline (Bphen), and tris(8-hydroxyquinolate)aluminum (Alq3). Examples of oxadiazoles and triazoles include compounds having structures represented by the following formulas.

[Chemical formula 2]

2-(4-Biphenyl)-5-(4-tert-butylphenyl)-1,3,4-oxadiazole 2-(4-Biphenyl)-5-(4-tert-butylphenyl)-1,2,4-triazole

Examples of functional groups having the property of transporting electrons further include substituted or unsubstituted aryl groups having 6 to 16 carbon atoms. The aryl groups having 6 to 16 groups are as described above.

When Y is a functional group capable of showing both the property of transporting holes and that of transporting electrons, it is preferred that Y be bound to the silicon atom via vinyl or phenyl group. This is because vinyl or phenyl group is a part that forms a π-conjugated system. Examples of functional groups capable of showing both the property of transporting holes and the property of transporting electrons include distyrylarenes, polycyclic aromatic hydrocarbons, aromatic fused rings, carbazole, and heterocyclic rings. Specific examples of such functional groups include 4,4'-bis(2,2-diphenyl-ethen-1-yl)diphenyl (DPVBi), 4,4'-bis(carbazol-9-yl)biphenyl (CBP), 4,4"-di(N-carbazolyl)-2',3',5',6'-tetraphenyl-p-terphenyl (CzTT), 1,3-bis(carbazol-9-yl)-benzene (m-CP), and 9,10-di(naphth-2-yl)anthracene (DNA).

[Chemical formula 3]

DPVBi

CBP

CzTT m-CP

[Chemical formula 4]

DNA

Examples of functional groups capable of showing both the property of transporting holes and the property of transporting electrons also include groups having a structure represented by the following formula.

[Chemical formula 5]

Further, examples of functional groups capable of showing both the property of transporting holes and the property of transporting electrons also include substituted or unsubstituted aryl groups having 6 to 16 carbon atoms. The aryl groups having 6 to 16 carbon atoms are as described above.

Examples of the above compounds (b), reactive silicones, include compounds having a structure represented by the following chemical formula.

[Chemical formula 6]

In the above chemical formula, n is an integer of 2 or more, and $R^1$ and $R^2$ independently represent a substituted or unsubstituted alkyl, alkenyl, aryl, or cyanoalkyl group having 1 to 10 carbon atoms. Forty percent by mole or less of the whole structure is vinyl, phenyl, or halogenated phenyl. A reactive silicone having the above structure in which both $R^1$ and $R^2$ are methyl group is preferred, and its methyl group content is preferably 60% by mole or more. Further, the reactive silicones having the above structure have at least one reactive group, such as hydroxyl group, in a molecule present at the end of the molecular chain or in a side chain.

The silane coupling agent may have the property of transporting charges. In order to make the silane coupling agent charge-transportable, a functional group that binds to the silicon atom directly or via vinyl or phenyl group and that can show at least one of the property of transporting holes and that of transporting electrons is selected for Y in the above general formula of the compound (a).

In the luminescent layer, the silane coupling agent surrounding the quantum dot may be the silane coupling agent itself, or a hydrolysate of the silane coupling agent, or a hydrolysate-condensation product of the silane coupling agent.

Particularly, it is preferred that the silane coupling agent surrounding the quantum dot be a hydrolysate-condensation product of the silane coupling agent. That is to say, it is preferred that the luminescent layer contains a hydrolysate-condensation product of the silane coupling agent. Such a luminescent layer becomes hardened. In the hardened luminescent layer, the quantum dots can exist stably and have improved life characteristics. Further, the silane coupling agent in the luminescent layer binds to a layer lying under the luminescent layer (the first electrode layer, the hole injection layer, etc.) so as to increase the adhesion between the luminescent layer and the layer lying under the luminescent layer and also so as to increase the thermal stability (Tg: glass transition temperature) of the luminescent layer. If a hole injection and transport layer, an electron injection and transport layer or the like is formed on the hardened luminescent layer by the use of a coating liquid, it is possible to form the layer stably without causing dissolution of the luminescent layer in a solvent in the coating liquid for forming the layer.

Examples of hydrolysate-condensation products of the silane coupling agent include (I) organopolysiloxanes having high strength, produced by hydrolyzing and polycondensing the above chloro- or alkoxy-silanes, etc. by means of e.g., sol-gel reaction, and (II) organopolysiloxanes produced by cross-linking the above reactive silicones.

Of the organopolysiloxanes (I), hydrolysate- or co-hydrolysate-condensation products of one, or two or more of the above-described silicon compounds are preferred.

Further, the luminescent layer may contain, together with the organopolysiloxane, stable organosilicone compounds that do not cause cross-linking reaction, such as dimethylpolysiloxane.

(3) Hole Transport Material

In the case where the luminescent layer further contains a hole transport material, the hole transport material may be any of the following compounds, for example: arylamine derivatives, anthracene derivatives, carbazole derivatives, thiophene derivatives, fluorene derivatives, distyrylbenzene derivatives, and spiro compounds. Specific examples of these compounds include 4,4'-bis[N-(1-naphthyl)-N-phenyl-amino]-biphenyl (α-NPD), N,N'-bis-(3-methylphenyl)-N, N'-bis(phenyl)-benzidine (TPD), 4,4',4"-tris[N-(3-methylphenyl)-N-phenyl-amino]-triphenylamine (MTDATA), 9,10-di-2-naphthylanthracene (DNA), 4,4-N,N'-dicarbazole-biphenyl (CBP), and 1,4-bis(2,2-diphenylvinyl)benzene (DPVBi). These compounds may be used either singly or in combination.

The ratio at which the quantum dot surrounded by the silane coupling agent and the hole transport material are present in the luminescent layer is preferably about 1:(0.1-2) (=the quantum dot surrounded by the silane coupling agent:the hole transport material). This is because if the quantum dot is used in an excessively low proportion, there is the possibility that the luminescent layer formed can not emit light sufficiently. On the other hand, if the quantum dot is used in an excessively high proportion, it may be difficult to form the luminescent layer and also difficult for the luminescent layer to acquire the property of transporting holes.

(4) Electron Transport Material

In the case where the luminescent layer further contains an electron transport material, the electron transport material may be any of the following compounds, for example: phenanthroline derivatives such as Bathocuproine (BCP) and Bathophenanthroline (Bphen), triazole derivatives, oxadiazole derivatives, and aluminum quinolinol complexes such as tris(8-quinolinol)aluminum complex (Alq3).

The ratio at which the quantum dot surrounded by the silane coupling agent and the electron transport material are present in the luminescent layer is preferably about 1:(0.1-2) (=the quantum dot surrounded by the silane coupling agent:the electron transport material). This is because if the quantum dot is used in an excessively low proportion, there is the possibility that the luminescent layer formed can not emit light sufficiently. On the other hand, if the quantum dot is used in an excessively high proportion, it may be difficult to form the luminescent layer and also difficult for the luminescent layer to acquire the property of transporting electrons.

In the case where the luminescent layer further contains both a hole transport material and an electron transport material, the ratio at which the quantum dot surrounded by the silane coupling agent, the hole transport material, and the electron transport material are present in the luminescent layer is preferably about 1:(0.1-2):(0.1-2) (=the quantum dot surrounded by the silane coupling agent:the hole transport material: the electron transport material). This is because if the quantum dot is used in an excessively low proportion, there is the possibility that the luminescent layer formed can not emit light sufficiently. On the other hand, if the quantum dot is used in an excessively high proportion, it may be difficult to form the luminescent layer and also difficult for the luminescent layer to acquire the property of transporting holes and that of transporting electrons.

The case where the luminescent layer further contains at least one of a hole transport material and an electron transport material is described in detail in JP2005-522005T, and so forth.

(5) Method for Forming Luminescent Layer

The luminescent layer can be formed in the following manner: the quantum dots, each quantum dot being surrounded by the silane coupling agent, are dispersed in solvent so as to form a luminescent-layer-forming coating liquid; and this coating liquid is applied to the first electrode layer so as to form the luminescent layer. For example, in order to form a luminescent layer composed of three layers that emit lights of red, green, and blue, the three primary colors, coating liquids for forming red-, green-, and blue-light-emitting layers are used. As mentioned above, since a quantum dot emits spectrum that varies depending on its particle diameter, the particle diameter of the quantum dot is controlled according to the desired color.

Any solvent can be used for the luminescent-layer-forming coating liquid, as long as it can be mixed with the quantum dots surrounded by the silane coupling agent and with the other components, and does not have influences on the coating liquid, e.g., does not make the coating liquid opaque. Examples of such solvents include aromatic hydrocarbon solvents such as xylene, toluene, cyclohexylbenzene, dihydrobenzofuran, trimethylbenzene, and tetramethylbenzene; aromatic heterocyclic compounds such as pyridine, pyrazine, furan, pyrrole, thiophene, and methylpyrrolidone; and aliphatic hydrocarbon solvents such as hexane, pentane, heptane, and cyclohexane. These solvents may be used either singly or in combination.

In the case where the luminescent-layer-forming liquid contains the quantum dots surrounded by the silane coupling agent and at least one of the hole transport material and the electron transport material, it can be prepared in the following manner, for example. At least one of the hole transport material and the electron transport material is first dissolved in a solvent. Then, the quantum dots surrounded by the silane coupling agent are dispersed in the solution.

Examples of processes that can be employed to apply the luminescent-layer-forming coating liquid include spin coating, ink-jet printing, casting, LB process, dispenser process, micro-gravure coating, gravure coating, bar coating, roll coating, wire-bar coating, dip coating, blade coating, spray coating, flexographic printing, offset printing, screen printing, and gravure printing.

After applying the luminescent-layer-forming coating liquid, the coating film formed may be dried. Any drying method can be used, as long as it can provide a uniform luminescent layer. For example, a hot plate, an infrared heater, or an oven can be used. Drying the coating film makes condensation reaction of the hydrolyzed silane coupling agent progress to harden the luminescent layer.

Figure 3:
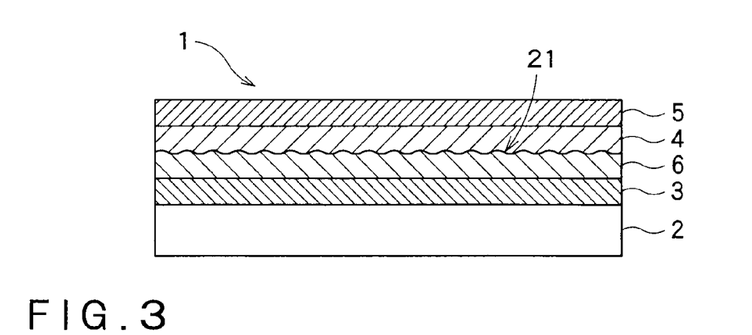
FIG. 3 is a sectional view showing a modification of the EL device, corresponding to FIG. 1.

As illustrated in FIG. 3, in the case where the luminescent layer 4 is formed on the hole transport layer (hole control layer) 6, which will be described later, it is possible to form the two layers simultaneously. For example, the hole transport layer 6 and the luminescent layer 4 can be formed simultaneously in the following manner. First, a coating liquid containing the quantum dots surrounded by the silane coupling agent and the hole transport material is prepared. Then, this coating liquid is applied to the first electrode layer so as to form a film, and phase separation (vertical phase separation) is caused in the film. If the luminescent layer and the hole transport layer are formed simultaneously in the above-described manner, they are layers produced by phase separation and have an interfacial boundary between them.

Figure 4:
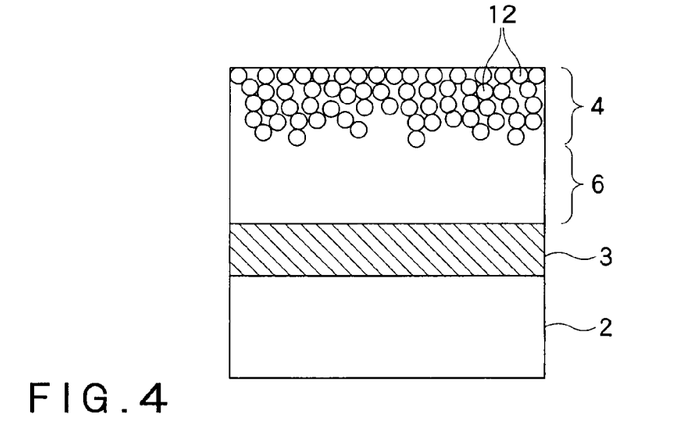
FIG. 4 is a diagrammatic view for explaining phase separation of a hole transport layer and a luminescent layer in an EL device.

When such an interfacial boundary 21 exists between the luminescent layer and the hole transport layer, it is macroscopically almost parallel to the surface of the first electrode layer 3 as illustrated in FIG. 3; and microscopically, it is not a clear boundary (having irregularities) as illustrated in FIG. 4. Therefore, the luminescent layer and the hole transport layer have an increased contact area, which leads to increase in the area where electrons and holes recombine with each other. Since the area where electrons and holes recombine with each other is present apart from the first electrode layer, the emission site increases (the number of the molecules that take part in emission of light increases), which leads to increase in luminous efficiency and also further increase in life.

Furthermore, since the interfacial boundary between the luminescent layer and the hole transport layer is not uniform (even) but irregular, even if the driving voltage is increased, holes and electrons are not excited and combine with each other all at once, which can prevent abrupt rise in luminous intensity. That is to say, it is possible to increase luminance gradually according to the driving voltage applied. This makes it easy to control luminance and gradation at low luminance, and also makes a complicated peripheral circuit for finely controlling the driving voltage unnecessary.

A specific example of methods for forming the luminescent layer and the hole transport layer simultaneously will be given below. A hole transport material is first dissolved in a solvent. Then the quantum dots surrounded by the silane coupling agent are dispersed in the solution so as to form a coating liquid. In this step, any of the above-described hole transport materials can be used as the hole transport material. It is preferred that the above solvent be a non-polar solvent. Examples of non-polar solvents useful herein include aromatic hydrocarbon solvents such as xylene, toluene, cyclohexylbenzene, dihydrobenzofuran, trimethylbenzene, and tetramethylbenzene; aromatic heterocyclic compounds such as pyridine, pyrazine, furan, pyrrole, thiophene, and methylpyrrolidone; and aliphatic hydrocarbon solvents such as hexane, pentane, heptane, and cyclohexane. These solvents may be used either singly or in combination.

Then, the coating liquid is applied to the first electrode layer so as to form a film. Examples of techniques that can be used to apply the coating liquid include spin coating, casting, micro-gravure coating, gravure coating, bar coating, roll coating, wire-bar coating, dip coating, spray coating, screen printing, flexographic printing, offset printing, and ink-jet printing.

Next, the solvent is removed from the coating film formed. As illustrated in FIG. 4, in the coating film from which the solvent has been removed, the hole transport material (not shown in the figure) and the quantum dots 12 surrounded by the silane coupling agent (not shown in the figure) separate from each other vertically to localize the hole transport material on the first electrode layer 3 side and the quantum dots 12 on the outermost surface side of the coating film, and the coating film hardens. In this manner, the hole transport layer and the luminescent layer are formed simultaneously. That is to say, the hole transport layer and the luminescent layer are formed at one time by phase separation.

In the above process, it is possible to control phase separation that occurs in the coating film by properly setting at least one of the following conditions: the type of the solvent, the weight-average molecular weight of the hole transport material, the content of the hole transport material in the coating liquid, the content of the quantum dots and the silane coupling agent in the coating liquid, the rate at which the solvent is removed, the atmosphere in which the solvent is removed, and the state of the layer surface to which the coating liquid is applied.

For example, the atmosphere in which the solvent is removed may be one containing vapor of a polar solvent. Such an atmosphere can localize the quantum dots surrounded by the silane coupling agent in the upper part of the coating film with higher certainty. Examples of polar solvents useful herein include water and alcohols such as methanol, ethanol, and isopropanol.

After applying the coating liquid, the film formed may be dried. Drying the coating film makes condensation reaction of the hydrolyzed silane coupling agent progress to harden the luminescent layer. The above-described drying methods can be used in this process, and further explanation of the drying methods will not be given here any more.

The luminescent layer can be formed in any thickness, as long as the luminescent layer can perform the function of providing a space where electrons and holes recombine with each other so as to emit light. The thickness of the luminescent layer may be about 1 to 500 nm, for example.

2. Hole Control Layer (Hole Injection and Transport Layer)

A hole control layer may be present between the luminescent layer and the anode. The hole control layer is formed in order to increase luminous efficiency by stabilizing the injection of holes into the luminescent layer and/or by smoothing the transport of holes. For example, when the first electrode layer serves as the anode, the hole control layer is formed between the first electrode layer and the luminescent layer. The hole transport layer 6 that has been described with reference to FIG. 3 is an embodiment of the hole control layer.

The hole control layer may be a hole injection layer (hole-injecting layer) having the function of stably injecting, into the luminescent layer, holes injected from the anode. The hole control layer also may be a hole transport layer having the function of transporting, into the luminescent layer, holes injected from the anode. In addition, the hole control layer also may be a laminate of the hole injection layer and the hole transport layer. Further, the hole control layer may be a single layer having both the function of injecting holes and the function of transporting holes.

When the luminescent layer further contains a hole transport material, or when the hole transport layer and the luminescent layer are formed simultaneously, it is preferred that the hole control layer be a hole injection layer.

For the hole control layer serving as the hole injection layer, any material can be used as the hole injection material (hole-injecting material), as long as it can stabilize the injection of holes into the luminescent layer. Examples of hole injection materials useful herein include phenylamines; starburst-type amines; phthalocyanines; oxides such as vanadium oxide, molybdenum oxide, ruthenium oxide, and aluminum oxide; and electrically conductive polymers such as amorphous carbon, polyaniline, polythiophene, polyphenylene vinylene, and derivatives thereof. The above electrically conductive polymers may be ones doped with acids. Specific examples of these compounds include 4,4'-bis[N-(1-naphthyl)-N-phenyl-amino]-biphenyl (α-NPD), 4,4',4"-tris(N,N-diphenyl-amino)-triphenylamine (TDATA), 4,4',4"-tris[N-(3-methylphenyl)-N-phenyl-amino]-triphenylamine (MTDATA), polyvinylcarbazole, and poly(3,4-ethylenedioxythiophene)/polystyrene sulfonic acid (PEDOT/PSS). These compounds can be used either singly or in combination.

The hole control layer serving as the hole injection layer may be formed in any thickness, as long as it can fully perform its function. Specifically, the thickness of the hole injection layer is preferably in the range of 5 to 200 nm, more preferably in the range of 10 to 100 nm.

For the hole control layer serving as the hole transport layer, any hole transport material can be used, as long as it can stably transport injected holes into the luminescent layer. Examples of hole transport materials include arylamine derivatives, anthracene derivatives, carbazole derivatives, thiophene derivatives, fluorene derivatives, distyrylbenzene derivatives, and spiro compounds. Specific examples of these compounds include 4,4'-bis[N-(1-naphthyl)-N-phenyl-amino]-biphenyl (α-NPD), 4,4'-bis-(3-methylphenyl)-N,N'-bis-(phenyl)-benzidine (TPD), 4,4',4"-tris[N-(3-methylphenyl)-N-phenyl-amino]-triphenylamine (MTDATA), 9,10-di-2-naphthylanthracene (DNA), 4,4-N,N'-dicarbazole-biphenyl (CBP), and 1,4-bis(2,2-diphenylvinyl)benzene (DPVBi). These compounds may be used either singly or in combination.

The hole control layer serving as the hole transport layer can be formed in any thickness, as long as it can fully perform its function. Specifically, the thickness of the hole transport layer is preferably in the range of 5 to 200 nm, more preferably in the range of 10 to 100 nm.

A dry process such as vacuum vapor deposition or a wet process such as spin coating can be used to form the hole control layer.

3. Electron Control Layer (Electron Injection and Transport Layer)

In the present invention, an electron control layer may be present between the luminescent layer and the cathode. The electron control layer is formed in order to increase luminous efficiency by stabilizing the injection of electrons into the luminescent layer and/or by smoothing the transport of electrons. For example, when the second electrode layer serves as the cathode, the electron control layer is formed between the second electrode layer and the luminescent layer.

The electron control layer may be an electron injection layer (electron-injecting layer) having the function of stably injecting, into the luminescent layer, electrons injected from the cathode. The electron control layer also may be an electron transport layer having the function of transporting, into the luminescent layer, electrons injected from the cathode. In addition, the electron control layer also may be a laminate of the electron injection layer and the electron transport layer. Further, the electron control layer also may be a single layer having both the function of injecting electrons and the function of transporting electrons.

If the luminescent layer further contains an electron transport material, it is preferred that the electron control layer be the electron injection layer.

For the electron control layer serving as the electron injection layer, any electron injection material (electron-injecting material) can be used, as long as it can stabilize the injection of electrons into the luminescent layer. Examples of electron injection materials include single alkali or alkali earth metals such as Ba, Ca, Li, Cs, Mg, and Sr; alkali metal alloys such as aluminum-lithium alloys; oxides of alkali or alkali earth metals such as magnesium oxide and strontium oxide; fluorides of alkali or alkali earth metals such as magnesium fluoride, calcium fluoride, strontium fluoride, barium fluoride, lithium fluoride, and cesium fluoride; and organic alkali metal complexes such as polymethylmethacrylate sodium polystyrenesulfonate. The electron injection layer may also be a multi-layered film of two or more of the above-enumerated materials, e.g., Ca/LiF.

The electron control layer serving as the electron injection layer can be formed in any thickness, as long as it can fully perform its function. Specifically, the thickness of the electron injection layer is preferably in the range of 0.1 to 200 nm, more preferably in the range of 0.5 to 100 nm.

On the other hand, any electron transport material can be used for the electron control layer serving as the electron transporting layer, as long as it can stably transport injected electrons into the luminescent layer. Examples of electron transport materials include phenanthroline derivatives such as Bathocuproine (BCP) and Bathophenanthroline (Bphen);

triazole derivatives; oxadiazole derivatives; and aluminum quinolinol complexes such as tris(8-quinolinol)aluminum complex (Alq3).

The electron control layer serving as the electron transport layer can be formed in any thickness, as long as it can fully perform its function. Specifically, the thickness of the electron transport layer is preferably in the range of 1 to 100 nm, more preferably in the range of 1 to 50 nm.

Examples of materials useful for single layers having both the function of injecting electrons and the function of transporting electrons include electron transport materials doped with an alkali or alkali earth metal such as Li, Cs, Ba, or Sr. Examples of electron transport materials useful herein include phenanthroline derivatives such as Bathocuproine (BCP) and Bathophenanthroline (Bphen). The molar ratio of the electron transport material to the dopant metal is preferably in the range of 1:1 to 1:3, more preferably in the range of 1:1 to 1:2. The electron transport materials doped with an alkali or alkali earth metal have relatively high electron-transferability and higher transmittance than single metals.

The single layer having both the function of injecting electrons and the function of transporting electrons can be formed in any thickness, as long as it can fully perform its function. Specifically, the thickness of such a single layer is preferably in the range of 0.1 to 100 nm, more preferably in the range of 0.1 to 50 nm.

A dry process such as vacuum vapor deposition or a wet process such as spin coating can be employed to form the electron control layer. When the luminescent layer is a hardened one, the electron control layer can be stably formed on the luminescent layer even by a wet process.

4. First Electrode Layer

The first electrode layer may be either the anode or the cathode.

For the first electrode layer, any material can be used as long as it is electrically conductive. For example, for extracting light from the first electrode layer side, it is preferred that the first electrode layer be transparent. Preferred examples of materials having both conductivity and transparency include In—Zn—O (IZO), In—Sn—O (ITO), ZnO—Al, and Zn—Sn—O. On the other hand, for extracting light from the second electrode layer side, the first electrode layer need not be transparent. In this case, metals can be used as materials having conductivity. Specific examples of metals useful herein include Au, Ta, W, Pt, Ni, Pd, Cr, Al alloys, Ni alloys, and Cr alloys.

Conventional processes of electrode film deposition can be used to form the first electrode layer. Examples of such processes include sputtering, ion plating, and vacuum vapor deposition. In order to pattern the first electrode layer, a photolithographic process can be used.

5. Second Electrode Layer

The second electrode layer may be either the anode or the cathode, as long as it serves as the opposite electrode to the first electrode layer.

For the second electrode layer, any material can be used as long as it is electrically conductive. For example, for extracting light from the second electrode layer side, it is preferred that the second electrode layer be transparent. On the other hand, for extracting light from the first electrode layer side, the second electrode layer need not be transparent. The above-described conductive materials for the first electrode layer can be used for the second electrode layer; further explanation of the conductive materials will not be given here any more.

For forming the second electrode layer, the above-described processes for forming the first electrode layer can be employed; further explanation of the processes will not be given here any more.

6. Substrate

As shown in FIG. 1, the first electrode layer may be formed on a substrate. The substrate is to support the first electrode layer, the luminescent layer, the second electrode layer, and the others.

For example, for extracting light from the substrate side, it is preferred that the substrate be transparent. Examples of transparent substrates useful herein include silica- or glass-made substrates. On the other hand, for extracting light from the second electrode layer side, the substrate need not be transparent. In this case, not only the above-described materials but also metals such as aluminum and its alloys, plastics, woven materials, non-woven materials, and the like can also be used for the substrate.

7. Insulating Layer

In the case where the first electrode layer is present pattern-wise on the substrate, an insulating layer may be formed at openings in the patterned first electrode layer on the substrate. The insulating layer is formed in order to prevent continuation between the adjacent film portions of the patterned first electrode layer, and between the first electrode layer and the second electrode layer. The insulating-layer-formed parts form non-luminescent regions.

Such an insulating layer is formed on the substrate, at openings in the first electrode layer. The insulating layer is usually formed in such a way that the insulating layer covers the edges of openings in the pattern of the first electrode layer.

For the insulating layer, any material can be used as long as it has insulating properties. Examples of insulating materials useful herein include photosensitive polyimide resins, photo-setting resins such as acrylic resins, thermosetting resins, and inorganic materials.

A conventional process such as a photolithographic or printing process can be employed to form the insulating layer.

The present invention may be embodied in other specific forms without departing from its spirit or essential characteristics. The above embodiment is therefore to be considered in all respects as illustrative and not restrictive. The scope of the invention is indicated by the appended claims rather than by the foregoing description and all changes that come within the meaning and range of equivalency of the claims are embraced therein.

EXAMPLES

The present invention will now be explained more specifically with reference to the following Examples and Comparative Examples.

Referential Example 1

Method of Replacement of Ligand

A silane coupling agent was added to dispersion of quantum dots (CdSe/ZnS core-shell-type nanoparticles, diameter: 5.2 nm) protected by TOPO (fluorescent semiconductor nanocrystals "Evidot" manufactured by evident TECHNOLOGIES, USA) to replace the ligand.

Specifically, 5 g of tetramethoxysilane (LS-540 manufactured by Shin-Etsu Chemical Co., Ltd., Japan), 1 g of phenyltrimethoxysilane (LS-2750 manufactured by Shin-Etsu Chemical Co., Ltd., Japan), and 2 g of 0.01 N HCl were first stirred at room temperature for 12 hours so as to form a copolymer compound (silane coupling agent). Toluene was added to the copolymer compound, and the mixture was stirred so as to form a 10 wt. % toluene solution of the silane coupling agent.

In an atmosphere of argon gas, 2 g of the 10 wt. % toluene solution of the silane coupling agent was added dropwise to 1 g of the stirred dispersion of the quantum dots protected by TOPO at room temperature (26° C.). After stirring this reaction solution for 12 hours, the atmosphere was changed from argon gas to air. Toluene was added to the reaction solution in an amount equal to the amount of the toluene lost by evaporation, and then 8 g of ethanol was added dropwise to the solution. Subsequently, the precipitates were centrifugally separated from the reaction solution and then subjected to reprecipitation for purification in the following manner. Specifically, the precipitates were mixed with 4 g of toluene so as to form dispersion, and 10 g of ethanol was added dropwise to the dispersion so as to produce purified precipitates. This re-precipitates-containing liquid was subjected to centrifugal separation, whereby a purified product of the quantum dots protected by the silane coupling agent was obtained.

Referential Example 2

Method of Replacement of Ligand

The procedure of Referential Example 1 was repeated, provided that the phenyltrimethoxysilane used in Referential Example 1 was replaced with decyltrimethoxysilane (LS-5258 manufactured by Shin-Etsu Chemical Co., Ltd., Japan), thereby obtaining a purified product of the quantum dots protected by the silane coupling agent.

Referential Example 3

Method of Replacement of Ligand

The procedure of Referential Example 1 was repeated, provided that only the tetramethoxysilane was used (the phenyltrimethoxysilane not used), thereby obtaining a purified product of the quantum dots protected by the silane coupling agent.

Example 1

A luminescent-layer-forming coating liquid was first prepared by dispersing, in toluene, the quantum dots protected by the silane coupling agent, produced in Referential Example 1.

Next, a glass substrate having thereon a patterned ITO electrode was spin-coated with the luminescent-layer-forming coating liquid. The coating film formed was heated on a hot plate at 150° C. to cause the silane coupling agent attached to the quantum dots to react for binding together molecules of the silane coupling agent as well as for binding together the silane coupling agent and the ITO electrode, thereby forming a luminescent layer.

A LiF film with a thickness of 1 nm and an Al film with a thickness of 100 nm were deposited on the luminescent layer by vacuum vapor deposition. In this manner, an EL device was produced.

A terminal on the ITO electrode and a terminal on the Al electrode were connected to a source of voltage. When a voltage of more than 3 V was applied, the EL device emitted light with a peak at 620 nm. This was identical to the photoluminescence spectrum of CdSe/ZnS quantum dot (particle diameter 5 nm) protected by TOPO. The EL device was excellent in stability, luminous efficiency, and luminance.

Comparative Example 1

A suspension of quantum dots (CdSe/ZnS core/shell type nanoparticles, diameter: 5.2 nm) protected by TOPO (fluorescent semiconductor nanocrystals "Evidot" manufactured by evident TECHNOLOGIES, USA) was first prepared. Then this suspension was applied to a glass substrate having thereon a patterned ITO electrode by spin coating to form a luminescent layer. After this, the procedure of Example 1 was repeated to produce an EL device.

A terminal on the ITO electrode and that on the Al electrode were connected to a source of voltage. When a voltage of more than 7 V was applied, the EL device emitted light with a peak at 620 nm. This was identical to the photoluminescence spectrum of CdSe/ZnS quantum dot (particle diameter 5 nm) protected by TOPO. Since the melting point of TOPO is as low as about 50° C., the EL device was poor in stability, and its luminous efficiency and luminance were low.

Example 2

A luminescent-layer-forming coating liquid was first prepared by dispersing, in toluene, the quantum dots protected by the silane coupling agent, produced in Referential Example 1. Then a glass substrate having thereon a patterned ITO electrode was spin-coated with the luminescent-layer-forming coating liquid. The coating film formed was heated on a hot plate at 150° C. to cause the silane coupling agent attached to the quantum dots to react for binding together molecules of the silane coupling agents as well as for binding together also the silane coupling agent and the ITO electrode, thereby forming a luminescent layer.

A film of a triazole derivative having the following formula was deposited on the luminescent layer by vacuum vapor deposition, whereby an electron control layer serving as an electron transport layer was formed.

[Chemical formula 7]

Next, a LiF film with a thickness of 1 nm and an Al film with a thickness of 100 nm were deposited on the electron transport layer by vacuum vapor deposition. In this manner, an EL device was produced.

A terminal on the ITO electrode and a terminal on the Al electrode were connected to a source of voltage. When a voltage of more than 3 V was applied, the EL device emitted light with a peak at 620 nm. This was identical to the photoluminescence spectrum of CdSe/ZnS quantum dot (particle diameter 5 nm) protected by TOPO. The EL device was excellent in stability, luminous efficiency, and luminance.

Example 3

A film of PEDOT:PSS was formed on a glass substrate having thereon a patterned ITO electrode by spin coating, thereby obtaining a hole control layer serving as a hole injection layer.

A luminescent-layer-forming coating liquid was prepared by dispersing, in toluene, the quantum dots protected by the silane coupling agent prepared in Referential Example 1. Subsequently, the hole injection layer was spin-coated with the luminescent-layer-forming coating liquid. The film formed was heated on a hot plate at 150° C. to cause the silane coupling agent attached to the quantum dots to react for binding together molecules of the silane coupling agent as well as for binding together also the silane coupling agent and the PEDOT:SS in the hole injection layer. In this manner, a luminescent layer was obtained.

A film of the triazole derivative having the above formula was deposited on the luminescent layer by vacuum vapor deposition, thereby forming an electron control layer serving as an electron transport layer. Subsequently, a LiF film with a thickness of 1 nm and an Al film with a thickness of 100 nm were deposited on the electron-transport layer by vacuum vapor deposition. In this manner, an EL device was produced.

A terminal on the ITO electrode and a terminal on the Al electrode were connected to a source of voltage. When a voltage of more than 3 V was applied, the EL device emitted light with a peak at 620 nm. This was identical to the photoluminescence spectrum of CdSe/ZnS quantum dot (particle diameter 5 nm) protected by TOPO. The EL device was excellent in stability, luminous efficiency, and luminance.

Example 4

A luminescent-layer-forming coating liquid was first prepared by dispersing, in toluene, the quantum dots protected by the silane coupling agent prepared in Referential Example 1 and TPD in a weight ratio of 1:1. A glass substrate having thereon a patterned ITO electrode was spin-coated with the luminescent-layer-forming coating liquid. The film formed was heated on a hot plate at 150° C. to cause the silane coupling agent attached to the quantum dots to react for binding together molecules of the silane coupling agent as well as for binding together also the silane coupling agent and the ITO electrode, thereby forming a luminescent layer. The luminescent layer was subjected to an AFM surface observation; it was confirmed that the quantum dots were localized on the layer surface side so as to form a layer.

A film of the triazole derivative having the above formula was deposited on the luminescent layer by vacuum vapor deposition, and an Alq3 film was further deposited on this film by vacuum vapor deposition, thereby obtaining an electron-control layer serving as an electron transport layer. Subsequently, a LiF film with a thickness of 1 nm and an Al film with a thickness of 100 nm were deposited on the electron transport layer by vacuum vapor deposition. In this manner, an EL device was produced.

A terminal on the ITO electrode and a terminal on the Al electrode were connected to a source of voltage. When a voltage of more than 3 V was applied, the EL device emitted light with a peak at 620 nm. This was identical to the photoluminescence spectrum of CdSe/ZnS quantum dot (particle diameter 5 nm) protected by TOPO. The EL device was excellent in stability, luminous efficiency, and luminance.

Example 5

A luminescent-layer-forming coating liquid was first prepared by dispersing, in toluene, the quantum dots protected by the silane coupling agent prepared in Referential Example 2, TPD, and triazole. In preparing the coating liquid, the quantum dots protected by the silane coupling agent, TPD, and the triazole were used in amounts of 40 parts by weight, 30 parts by weight, and 30 parts by weight, respectively. A glass substrate having thereon a patterned ITO electrode was spin-coated with the luminescent-layer-forming coating liquid. The film formed was heated on a hot plate at 150° C. to cause the silane coupling agent attached to the quantum dots to react for binding together molecules of the silane coupling agent as well as for binding together also the silane coupling agent and the ITO electrode, thereby forming a luminescent layer. The luminescent layer was subjected to an AFM surface observation; it was confirmed that the quantum dots protected by the silane coupling agent, TPD, and the triazole were present on the layer surface side in a random fashion.

A LiF film with a thickness of 1 nm and an Al film with a thickness of 100 nm were deposited on the luminescent layer by vacuum vapor deposition. In this manner, an EL device was produced.

A terminal on the ITO electrode and a terminal on the Al electrode were connected to a source of voltage. When a voltage of more than 3 V was applied, the EL device emitted light with a peak at 620 nm. This was identical to the photoluminescence spectrum of CdSe/ZnS quantum dot (particle diameter 5 nm) protected by TOPO. The EL device was excellent in stability, luminous efficiency, and luminance.

Example 6

A glass substrate having thereon a patterned ITO electrode was cleaned. A hole-injection-layer forming coating liquid was prepared by adding, as the silane coupling agent, γ-glycidoxypropylmethoxysilane (TSL8350 manufactured by Toshiba Silicone Co., Ltd., Japan) to aqueous dispersion of poly(3,4-ethylenedioxythiophene)/polystyrenesulfonic acid (PEDOT/PSS) (Baytron P CH8000 manufactured by H.C. Starck, Germany) in such an amount that the concentration of the silane coupling agent would be 5% of the total solid. Dropping the hole-injection-layer forming coating liquid on the center part of the substrate, the substrate was spin-coated with the coating liquid. The film formed was heated on a hot plate at 150° C. for 15 minutes, thereby obtaining a hole-control layer serving as a hole injection layer.

Next, a luminescent-layer-forming coating liquid was prepared by dispersing, in toluene, the quantum dots protected by the silane coupling agent prepared in Referential Example 3. The hole injection layer was spin-coated with the luminescent-layer-forming coating liquid. The film formed was heated on a hot plate at 150° C. to cause the silane coupling agent attached to the quantum dots to react for binding together molecules of the silane coupling agent as well as for binding together also the silane coupling agent and PEDOT/PSS in the hole injection layer. In this manner, a luminescent layer was obtained.

A 20-nm thick film of the triazole derivative having the above formula and a 20-nm thick film of Alq3 were deposited on the luminescent layer by vacuum vapor deposition, thereby obtaining an electron control layer serving as an electron transport layer. Subsequently, a LiF film with a thickness of 1 nm and an Al film with a thickness of 100 nm were deposited on the electron transport layer by vacuum vapor deposition. In this manner, an EL device was produced.

A terminal on the ITO electrode and a terminal on the Al electrode were connected to a source of voltage. When a voltage of more than 3 V was applied, the EL device emitted light with a peak at 620 nm. This was identical to the photoluminescence spectrum of CdSe/ZnS dot (particle diameter 5 nm) protected by TOPO. The EL device was excellent in stability, luminous efficiency, and luminance.

The invention claimed is:

1. An electroluminescent device comprising:
   a first electrode layer;
   a second electrode layer situated opposite to the first electrode layer; and
   a luminescent layer situated between the first electrode layer and the second electrode layer,
   wherein the luminescent layer has a quantum dot, and situated around the quantum dot is a silane coupling agent,
   wherein the luminescent layer includes a hydrolysate-condensation product of the silane coupling agent to get hardened, and
   wherein the hydrolysate-condensation product of the silane coupling agent is an organopolysiloxane that is a hydrolysate- or co-hydrolysate-condensation product of one, or two or more silicon compounds having the formula $Y_n SiX_{(4-n)}$, in which:
   Y represents a functional group bound to a silicon atom via a vinyl group or a phenyl group, the functional group having at least one of the property of transporting holes and the property of transporting electrons,
   X represents an alkoxyl group, an acetyl group, or a halogen; and
   n is either 2 or 3.

2. The electroluminescent device according to claim 1, wherein the quantum dot has:
   a core part made of a semiconductor fine particle; and
   a shell part covering the core part, the shell part being made from a material having a greater band gap than the semiconductor fine particle.

* * * * *